(12) United States Patent
Chevallier et al.

(10) Patent No.: US 7,020,006 B2
(45) Date of Patent: Mar. 28, 2006

(54) DISCHARGE OF CONDUCTIVE ARRAY LINES IN FAST MEMORY

(75) Inventors: Christophe Chevallier, Palo Alto, CA (US); Darrell Rinerson, Cupertino, CA (US)

(73) Assignee: Unity Semiconductor Corporation

( * ) Notice: Subject to any disclaimer, the term of this patent is extended or adjusted under 35 U.S.C. 154(b) by 6 days.

(21) Appl. No.: 10/922,202

(22) Filed: Aug. 18, 2004

(65) Prior Publication Data
US 2005/0018516 A1  Jan. 27, 2005

Related U.S. Application Data

(63) Continuation-in-part of application No. 10/330,150, filed on Dec. 26, 2002, now Pat. No. 6,798,685.

(60) Provisional application No. 60/424,083, filed on Nov. 5, 2002, provisional application No. 60/422,922, filed on Oct. 31, 2002, provisional application No. 60/400,849, filed on Aug. 2, 2002.

(51) Int. Cl.
*G11C 11/00* (2006.01)
(52) U.S. Cl. ........................... 365/148; 365/100
(58) Field of Classification Search ................ 365/100, 365/148, 157, 158
See application file for complete search history.

(56) References Cited

U.S. PATENT DOCUMENTS

| | | | |
|---|---|---|---|
| 3,886,577 A | 5/1975 | Buckley | 257/3 |
| 4,839,859 A * | 6/1989 | Moopenn et al. | 365/100 |
| 5,296,716 A | 3/1994 | Ovshinsky et al. | 257/3 |
| 5,933,365 A * | 8/1999 | Klersy et al. | 365/148 |
| 6,088,286 A | 7/2000 | Yamauchi et al. | 365/230.06 |
| 6,204,139 B1 | 3/2001 | Liu et al. | 438/385 |
| 6,385,079 B1 * | 5/2002 | Tran | 365/148 |
| 6,456,525 B1 * | 9/2002 | Perner et al. | 365/171 |
| 6,473,332 B1 | 10/2002 | Ignatiev et al. | 365/148 |
| 6,531,371 B1 | 3/2003 | Hsu et al. | 438/385 |
| 6,567,297 B1 * | 5/2003 | Baker | 365/148 |
| 6,870,755 B1 * | 3/2005 | Rinerson et al. | 365/148 |

OTHER PUBLICATIONS

A. Beck, J. Bednorz, A. Bietsch, Ch. Gerber, C. Rossel, D. Widmer, "Reproducible switching effect in thin oxide films for memory applications," Applied Physics Letters, vol. 77, No. 1, Jul. 3, 2000, pp. 139-141.
ISSI, "IS62LV1288BLL—128Kx8 Low Power and Low Vcc CMOS Static RAM," Intergrated Silicon Solution, Inc, Rev A Aug. 10, 2002, pp 1-10.
Liu et al., "A New Concept for Non-Volatile Memory: The Electric-Pulse Induced Resistive Change Effect in Colossal Magnetoresistive Thin Films," Non-Volatile Memory Technology Symposium, Nov. 7, 2001, pp. 1-7.
Liu et al., "Electric-pulse-induced reversibile resistance change effect in magnetoresistive films," Applied Physics Letters, vol. 76, No. 19, May 8, 2000, pp. 2749-2751.
*Oxides and Oxide Films*, vol. 6, edited by Ashok. K. Vijh, Chapter 4 by David Oxley, "Memory Effects in Oxide Films," (Marcel Drekker 1981), pp. 251-325.
C. Rossel, G.I. Meijer, D. Brémaud, D. Widmer, "Electrical current distribution across a metal-insulator-metal structure during bistable switching," Journal of Applied Physics, vol. 90, No. 6, Sep. 15, 2001, pp. 2892-2898.

(Continued)

Primary Examiner—Tan T. Nguyen (57) ABSTRACT

Circuitry that discharges conductive array lines is provided. Generally, the conductive array lines are simultaneously selected and apply an appropriate programming pulse. Accordingly, the conductive array lines need to be discharged in connection with a write operation. The discharge can occur either prior to or following a write operation.

43 Claims, 9 Drawing Sheets

OTHER PUBLICATIONS

J.G. Simmons and R.R. Verderber, "New Conduction and Reversible Memory Phenomena in Thin Insulating Films," Proc. Roy. Soc. A., 301 (1967), pp. 77-102.

R.E. Thurstans and D.P. Oxley, "The Electroformed metal-insulator-metal structure: A comprehensive model," J. Phys. D.: Appl. Phys. 35 (2002), Apr. 2, 2002, pp. 802-809.

Y. Watanabe, J.G. Bednorz, A. Bietsch, Ch. Gerber, D. Widmer, A. Beck, "Current-driven insulator-conductor transition and nonvolatile memory in chromium-doped SrTiO3 single crystals," Applied Physics Letters, vol. 78, No. 23, Jun. 4, 2001, pp. 3738-3740.

* cited by examiner

Discharge at start of write select signal

FIG. 5

Discharge at end of write select signal

FIG. 6

Discharge at end of write operation

FIG. 7

Discharge at start of write select signal and end of write select operation

FIG. 8

Discharge during signal transitions

FIG. 9

Discharge with delayed addresses

Signal Transition Detection Timing Diagram

FIG. 11B

DISCHARGE OF CONDUCTIVE ARRAY LINES IN FAST MEMORY

CROSS-REFERENCE TO RELATED APPLICATIONS

This application is a continuation-in-part of U.S. patent application No. Application Ser. No. 10/330,150, filed Dec. 26, 2002 now U.S. Pat. No. 6,798,685, which claims the benefit of U.S. Provisional Application No. 60/400,849, filed Aug. 2, 2002, U.S. Provisional Application No. 60/422,922, filed Oct. 31, 2002, and U.S. Provisional Application 60/424,083, filed Nov. 5, 2002, all of which are incorporated herein by reference in their entireties and for all purposes. This application is related to PCT Patent Application No. PCT/US04/13836, filed May 3, 2004, incorporated herein by reference in its entirety and for all purposes.

BACKGROUND OF THE INVENTION

1. Field of the Invention

The present invention relates to re-writeable non-volatile computer memory having very small feature sizes.

2. Description of the Related Art

Memory can either be classified as volatile or nonvolatile. Volatile memory is memory that loses its contents when the power is turned off. In contrast, non-volatile memory does not require a continuous power supply to retain information. Most non-volatile memories use solid-state memory devices as memory elements.

Since the 1960s, a large body of literature has evolved that describes switching and memory effects in metal-insulator-metal structures with thin insulators. One of the seminal works was "New Conduction and Reversible Memory Phenomena in Thin Insulating Films" by J. G. Simmons and R. R. Verderber in 301 Proc. Roy. Soc. 77–102 (1967), incorporated herein by reference for all purposes. Although the mechanisms described by Simmons and Verderber have since been cast into doubt, their contribution to the field is great.

However, nobody has successfully implemented a metal-insulator-metal structure into a commercial solid-state memory device. In the text "Oxides and Oxide Films," volume 6, edited by A. K. Vijh (Marcel Drekker 1981) 251–325, incorporated herein by reference for all purposes, chapter 4, written by David P. Oxley, is entirely devoted to "Memory Effects in Oxide Films." In that text, Oxley says "It is perhaps saddening to have to record that, even after 10 years of effort, the number of applications for these oxide switches is so limited." He goes on to describe a "need for caution before any application is envisaged. This caution can only be exercised when the physics of the switching action is understood; this, in turn, must await a full knowledge of the transport mechanisms operating in any switch for which a commercial use is envisaged."

In 2002, over twenty years after writing that chapter, Oxley revisited the subject in "The Electroformed metal-insulator-metal structure: A comprehensive model" by R. E. Thurstans and D. P. Oxley 35 J. Phys. D. Appl. Phys. 802–809, incorporated herein by reference for all purposes. In that article, the authors describe a model that identifies the conduction process as "trap-controlled and thermally activated tunneling between metal islands produced in the forming process." "Forming" (or "electroforming") is described as "the localized filamentary movement of metallic anode material through the dielectric, induced by the electric field. Here it is important to note that the evaporated dielectric may contain voids and departures from stoichiometry. When resulting filaments through the dielectric carry sufficient current, they rupture to leave a metal island structure embedded in the dielectric. Electronic conduction is possible through this structure by activating tunneling."

However, the authors caution, "The forming process is complex and inherently variable. Also tunneling barriers are susceptible to changes in their characteristics when exposed to water vapour, organic species and oxygen. . . . Thus, device characteristics can never be expected to be produced consistently or be stable over long periods without passivation, effective encapsulation and a better understanding of the dynamics of the forming process."

In seemingly unrelated research, certain conductive metal oxides (CMOs), have been identified as exhibiting a memory effect after being exposed to an electronic pulse. U.S. Pat. No. 6,204,139, issued Mar. 20, 2001 to Liu et al., incorporated herein by reference for all purposes, describes some perovskite materials that exhibit memory characteristics. The perovskite materials are also described by the same researchers in "Electric-pulse-induced reversible resistance change effect in magnetoresistive films," Applied Physics Letters, Vol. 76, No. 19, 8 May 2000, and "A New Concept for Non-Volatile Memory: The Electric-Pulse Induced Resistive Change Effect in Colossal Magnetoresistive Thin Films," in materials for the 2001 Non-Volatile Memory Technology Symposium, all of which are hereby incorporated by reference for all purposes.

In U.S. Pat. No. 6,531,371 entitled "Electrically programmable resistance cross point memory" by Hsu et al, incorporated herein by reference for all purposes, resistive cross point memory devices are disclosed along with methods of manufacture and use. The memory device comprises an active layer of perovskite material interposed between upper electrodes and lower electrodes.

Similarly, the IBM Zurich Research Center has also published three technical papers that discuss the use of metal oxide material for memory applications: "Reproducible switching effect in thin oxide films for memory applications," Applied Physics Letters, Vol. 77, No. 1, 3 Jul. 2000, "Current-driven insulator-conductor transition and nonvolatile memory in chromium-doped $SrTiO_3$ single crystals,"Applied Physics Letters, Vol. 78, No. 23, 4 Jun. 2001, and "Electric current distribution across a metal-insulator-metal structure during bistable switching," Journal of Applied Physics, Vol. 90, No. 6, 15 Sep. 2001, all of which are hereby incorporated by reference for all purposes.

There are continuing efforts to incorporate solid state memory devices into a commercial non-volatile RAM.

BRIEF DESCRIPTION OF THE DRAWINGS

The invention may best be understood by reference to the following description taken in conjunction with the accompanying drawings, in which.

It is to be understood that, in the drawings, like reference numerals designate like structural elements. Also, it is understood that the depictions in the FIGS. are not necessarily to scale.

DETAILED DESCRIPTION OF THE PREFERRED EMBODIMENTS

In the following description, numerous specific details are set forth to provide a thorough understanding of the present invention. It will be apparent, however, to one skilled in the art that the present invention may be practiced without some or all of these specific details. In other instances, well known process steps have not been described in detail in order to avoid unnecessarily obscuring the present invention.

Overview

Previous memories either require high current to program the cells, (such as EPROM programming with hot electron injection) or high voltage. When a high programming current is necessary, it is sufficient to float unselected lines, since any charge that may be left from a prior operation cannot generate enough current to create a disturbance of unselected cells. For such memories with a slow program pulse (between 100 μs and 10 ms), the high voltage programming pulse is controlled so that the desired cell is selected, before the high voltage pulse rises, and then the desired cell is deselected, after the high voltage pulse has fallen. This timing technique prevents unselected cells to be subjected inadvertently to high voltages.

A particularity of certain multi-resistive state materials is that they react in nanoseconds and takes only a few microamperes (typically ten to forty μA) to change resistive state. A memory circuit that uses such memory would typically have a write cycle of 200 ns or less. In comparison, other non-volatile memory technology requiring current to program (flash, MRAM) use hundred or more microamperes, and microseconds to program. The RC time constant of most memory arrays is typically in the order of a few nanoseconds (the resistance of one array line times the capacitance of that line—for example a 1 pF line with a 2 k ohm lines would have a 2 ns time constant). Longer lines would result in longer time constant and would not be suitable for fast (typically sub-100 ns, but may be as much as 200 ns) access time, which is desirable in many types of memories. Because of the fast programming speed of the multi-resistive state materials, a floating line, with a 1 pF capacitance, can store enough charge to program a multi-resistive state cell, creating a "disturb" condition. This is not possible with a flash cell, where the cell itself would have discharged the floating line.

In high-speed multi-resistive state memory, instead of first selecting a cell, then applying a programming pulse, and then deselecting the cell, time can be saved by simultaneously applying the selection and the programming pulse. However, such a methodology creates the risk of creating programming conditions before the desired cell is selected, also resulting in disturbing unselected cells.

Additionally, there are cases where selected lines need to be discharged. For example, if two consecutive write operations happen on the same array line, but on different memory cells of the line, the line may have to be switched from one polarity to another polarity very fast. The line drivers, however, may not be strong enough. Even if the line drivers were strong enough, the difference in time to reach the new voltage may be critical due to the fast switching nature of the multi-resistive state memory. Such cells programmed with a lower or delayed voltage may not exhibit the same characteristics as cells programmed from discharged lines. Also, during a consecutive read on two cells, the sensing circuit may not have the mechanism to actively pull down the line to prepare for the second read cycle fast enough, and a separate discharge mechanism may be preferable.

Another issue relates to the length of the programming operation. If the cell is programmed too long, its new value may be too high, and may take a long time to reverse, resulting in longer programming times. In some cases the multi-resistive state material also exhibits saturation if programmed too long in which its resistivity drops back rather than further increase.

The Memory Array

Conventional nonvolatile memory requires three terminal MOSFET-based devices. The layout of such devices is not ideal, usually requiring an area of at least 8 $f^2$ for each memory cell, where f is the minimum feature size. However, not all memory elements require three terminals. If, for example, a memory element is capable of changing its electrical properties (e.g., resistivity) in response to a voltage pulse, only two terminals are required. With only two terminals, a cross point array layout that allows a single cell to be fabricated to a size of 4 $f^2$ can be utilized.

Figure 1A:
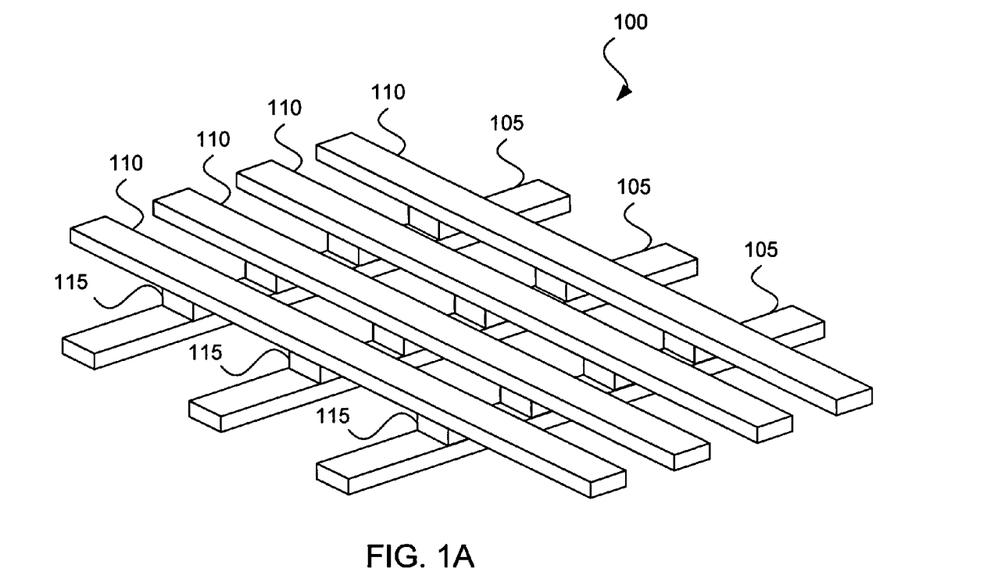
FIG. 1A depicts a perspective view of an exemplary cross point memory array employing a single layer of memory.

FIG. 1A depicts a perspective view of an exemplary cross point memory array 100 employing a single layer of memory. A bottom layer of x-direction conductive array lines 105 is orthogonal to a top layer of y-direction conductive array lines 110. The x-direction conductive array lines 105 act as a first terminal and the y-direction conductive array lines 110 act as a second terminal to a plurality of memory plugs 115, which are located at the intersections of the conductive array lines 105 and 110. The conductive array lines 105 and 110 are used to both deliver a voltage pulse to the memory plugs 115 and carry current through the memory plugs 115 in order to determine their resistive states.

Conductive array line layers 105 and 110 can generally be constructed of any conductive material, such as aluminum, copper, tungsten or certain ceramics. Depending upon the material, a conductive array line would typically cross between 64 and 8192 perpendicular conductive array lines. Fabrication techniques, feature size and resistivity of material may allow for shorter or longer lines. Although the x-direction and y-direction conductive array lines can be of equal lengths (forming a square cross point array) they can also be of unequal lengths (forming a rectangular cross point array), which may be useful if they are made from different materials with different resistivities.

Figure 2A:
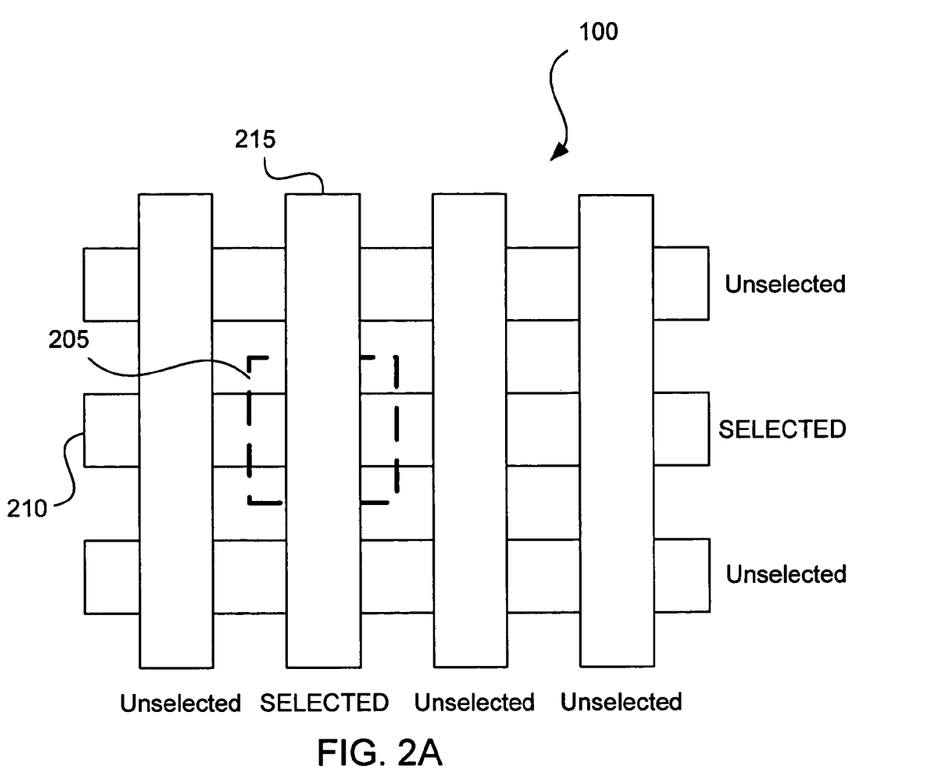
FIG. 2A depicts a plan view of selection of a memory cell in the cross point array depicted in FIG. 1A.
Figure 2B:
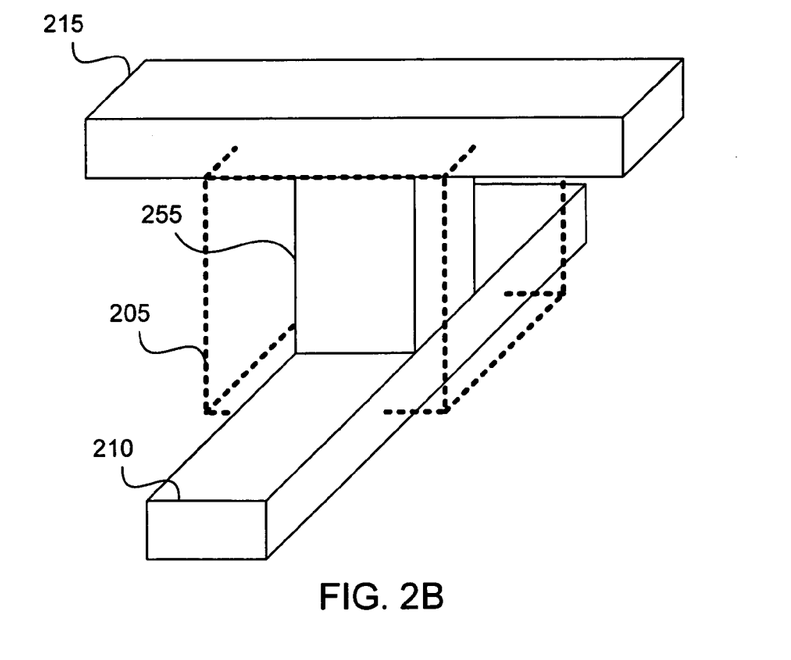
FIG. 2B depicts a perspective view of the boundaries of the selected memory cell depicted in FIG. 2A.

FIG. 2A illustrates selection of a memory cell 205 in the cross point array 100. The point of intersection between a single x-direction conductive array line 210 and a single y-direction conductive array line 215 uniquely identifies the single memory cell 205. FIG. 2B illustrates the boundaries of the selected memory cell 205. The memory cell is a repeatable unit that can be theoretically extended in one, two or even three dimensions. One method of repeating the memory cells in the z-direction (orthogonal to the x-y plane) is to use both the bottom and top surfaces of conductive array lines 105 and 110, creating a stacked cross point array.

Figure 1B:
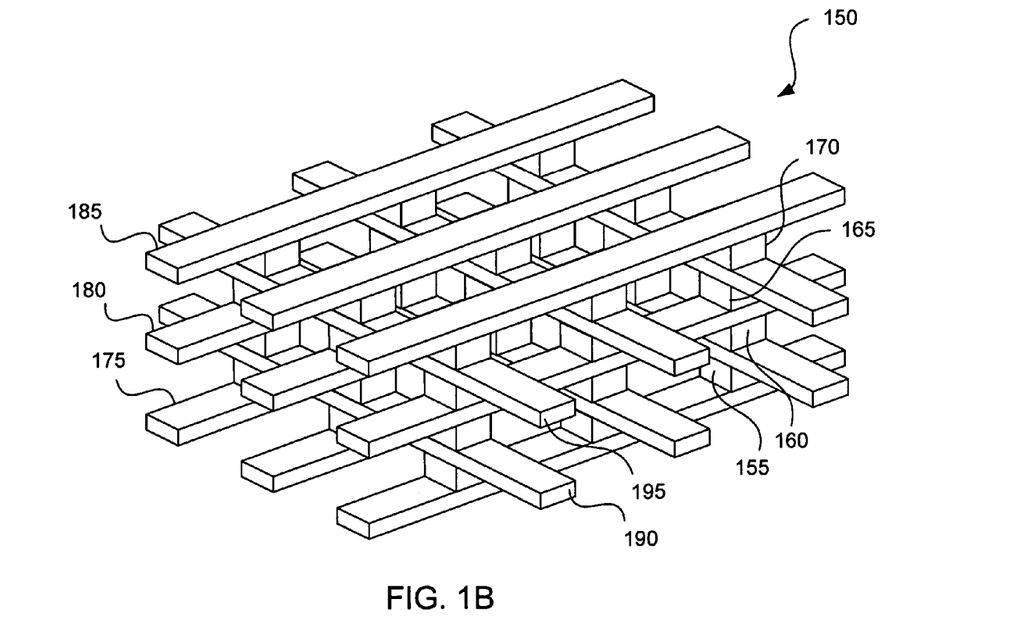
FIG. 1B depicts a perspective view of an exemplary stacked cross point memory array employing four layer of memory.

FIG. 1B depicts an exemplary stacked cross point array 150 employing four memory layers 155, 160, 165, and 170. The memory layers are sandwiched between alternating layers of x-direction conductive array lines 175, 180 and 185 and y-direction conductive array lines 190 and 195 such that each memory layer 155, 160, 165, and 170 is associated with only one x-direction conductive array line layer and one y-direction conductive array line layer. Although the top conductive array line layer 185 and bottom conductive array line layer 175 are only used to supply voltage to a single memory layer 155 and 170, the other conductive array line layers 180, 190, and 195 can be used to supply voltage to both a top and a bottom memory layer 155, 160, 165, or 170.

Referring back to FIG. 2B, the repeatable cell that makes up the cross point array 100 can be considered to be a memory plug 255, plus ½ of the space around the memory plug, plus ½ of an x-direction conductive array line 210 and ½ of a y-direction conductive array line 215. Of course, ½ of a conductive array line is merely a theoretical construct, since a conductive array line would generally be fabricated to the same width, regardless of whether one or both surfaces of the conductive array line was used. Accordingly, the very top and very bottom layers of conductive array lines (which use only one surface) would typically be fabricated to the same size as all other layers of conductive array lines.

One benefit of the cross point array is that the active circuitry that drives the cross point array 100 or 150 can be placed beneath the cross point array, therefore reducing the footprint required on a semiconductor substrate. However, the cross point array is not the only type of memory array that can be used with a two-terminal memory element. For example, a two-dimensional transistor memory array can incorporate a two-terminal memory element. While the memory element in such an array would be a two-terminal device, the entire memory cell would be a three-terminal device.

Figure 3:
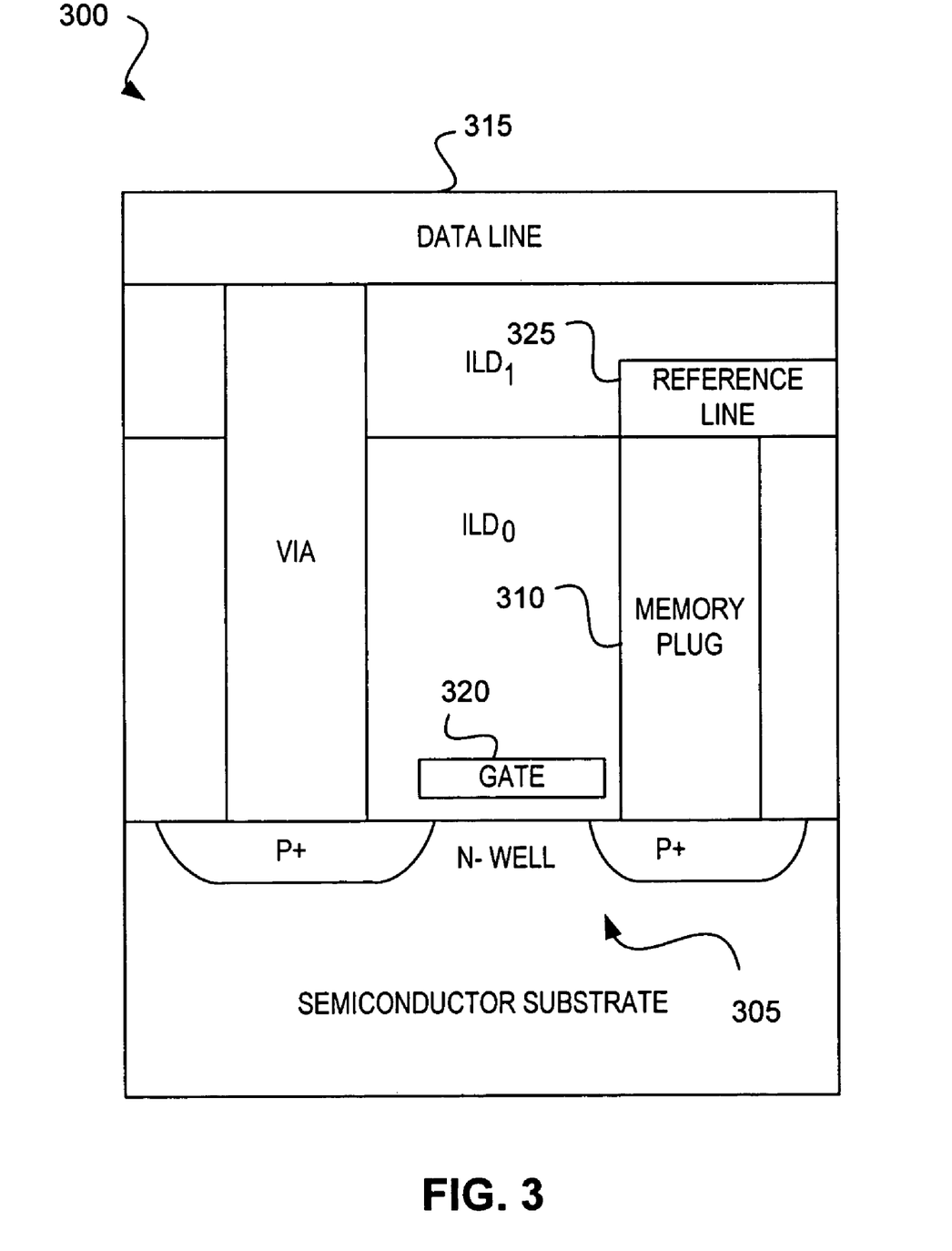
FIG. 3 depicts a generalized cross-sectional representation of a memory cell that can be used in a transistor memory array.

FIG. 3 is a generalized diagrammatic representation of a memory cell 300 that can be used in a transistor memory array. Each memory cell 300 includes a transistor 305 and a memory plug 310. The transistor 305 is used to permit current from the data line 315 to access the memory plug 310 when an appropriate voltage is applied to the select line 320, which is also the transistor's gate. The reference line 325 might span two cells if the adjacent cells are laid out as the mirror images of each other.

Memory Chip Configuration

Figure 4A:
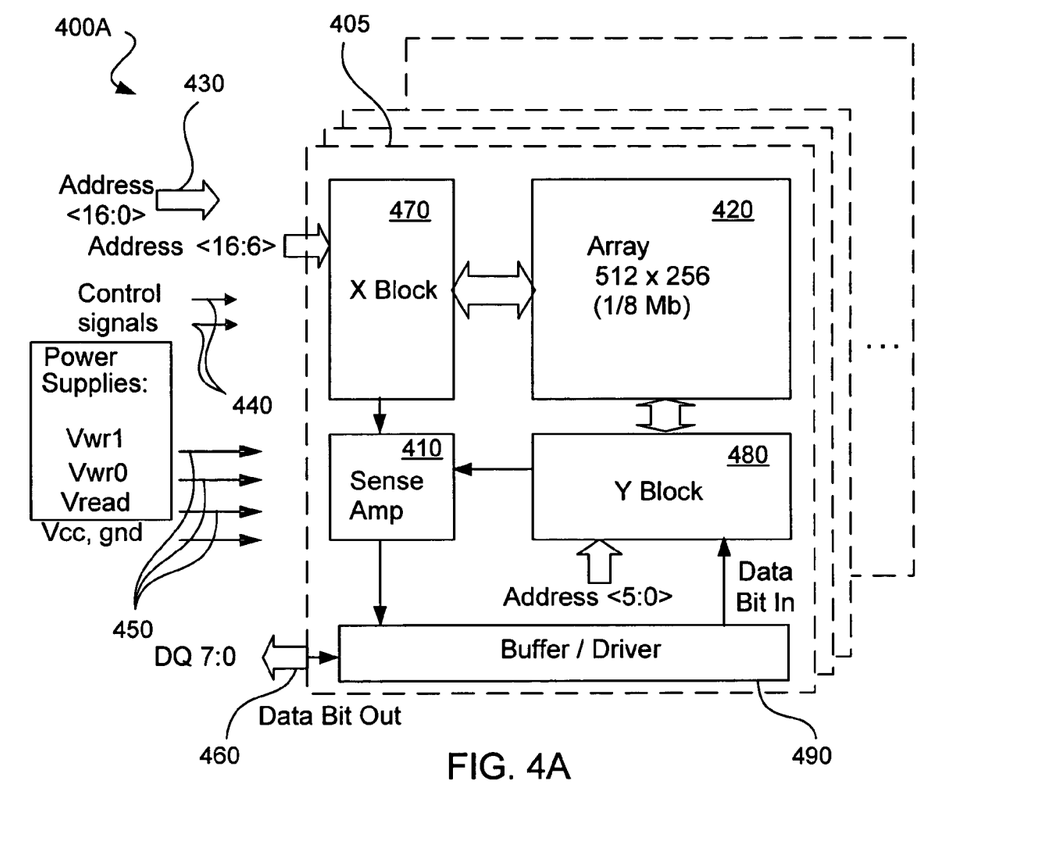
FIG. 4A depicts a block diagram of a representative implementation of an exemplary 1 MB memory.

FIG. 4A is a block diagram of a representative implementation of an exemplary 1 MB memory 400A. Physical layouts might differ, but each memory bit block 405 can be formed on a separate portion of a semiconductor substrate. Input signals into the memory 400A can include an address bus 430, a control bus 440, some power supplies 450 (typically Vcc and ground—the other signals of bus 450 can be internally generated by the 1 MB memory 400A), and a data bus 460. The control bus 440 typically includes signals to select the chip, to signal whether a read or write operation should be performed, and to enable the output buffers when the chip is in read mode. The address bus 430 specifies which location in the memory array is accessed—some addresses going to the X block 470 (typically including a predecoder and an X-decoder) to select one line out of the horizontal array lines. The other addresses go to a Y block 480 (typically including a predecoder and a Y-decoder) to apply the appropriate voltage on specific vertical lines. Each memory bit block 405 operates on one line of the memory chip data bus 460.

Figure 4B:
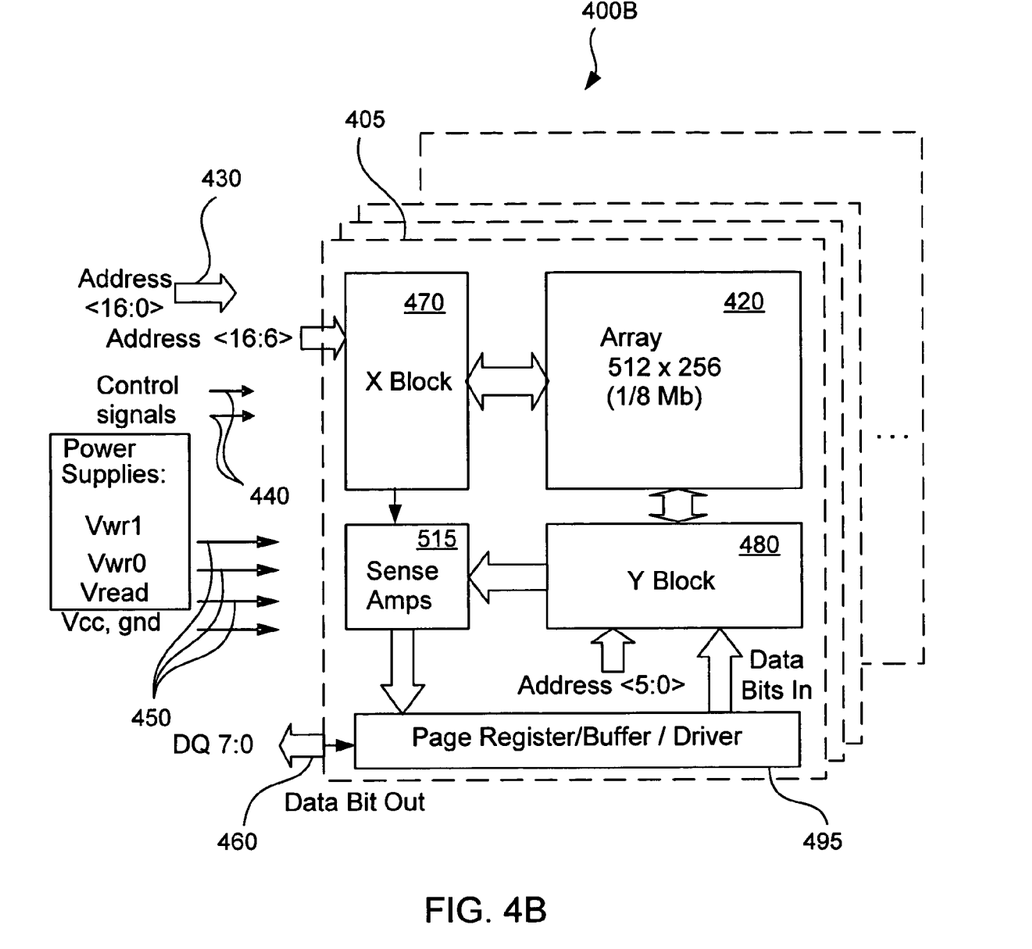
FIG. 4B depicts a block diagram of an exemplary memory that includes sensing circuits that are capable of reading multiple bits.

The reading of data from a memory array 420 is relatively straightforward: an x-line is energized, and current is sensed by the sensing circuits 410 on the energized y-lines and converted to bits of information. FIG. 4B is a block diagram of an exemplary memory 400B that includes sensing circuits 415 that are capable of reading multiple bits. The simultaneous reading of multiple bits involves sensing current from multiple y-lines simultaneously.

During a write operation, the data is applied from the data bus 460 to the input buffers and data drivers 490 to the selected vertical lines, or bit lines. Specifically, when binary information is sent to the memory chip 400B, it is stored in latch circuits within the circuits 495. Within the circuits 495, each y-line can either have an associated driver circuit or a group of y-lines can share a single driver circuit if the non-selected lines in the group are held to a constant voltage that would not cause the unselected memory plugs to experience any change in resistance. As an example, there may be 1024 y-lines in a cross point array, and the page register may include 8 latches, in which case the y-block would decode 1 out of 128 y-lines and connect the selected lines to block 495. The driver circuit then writes the 1 or 0 to the appropriate memory plug. The writing can be performed in multiple cycles. In a scheme described in PCT Patent Application No. PCT/JUS04/13836, filed May 3, 2004, already incorporated herein by reference, all the 1s can be written during a first cycle and all the 0s can be written during a second cycle. As described below, certain memory plugs can have multiple stable distinct resistive states. With such multi-level resistance memory plugs, driver circuits could program, for example, states of 00, 01, 10 or 11 by varying write voltage magnitude or pulse length.

It is to be noted that such an architecture can be expanded to create a memory where one array handles all the bits of the data bus, as opposed to having multiple arrays, or memory bit blocks as described above. For example, if the data bus, or memory data organization, also called data width, is 16-bit wide, the y-block of one cross point array can be made to decode 16 lines simultaneously. By applying the techniques of simultaneous reads and 2-cycle writes, such a memory chip with only one array can read and program 16-bit words.

Memory Plug

Each memory plug contains layers of materials that may be desirable for fabrication or functionality. For example, a non-ohmic characteristic that exhibit a very high resistance regime for a certain range of voltages ($V_{NO-}$ to $V_{NO+}$) and a very low resistance regime for voltages above and below that range might be desirable. In a cross point array, a non-ohmic characteristic could prevent leakage during reads and writes if half of both voltages were within the range of voltages $V_{NO-}$ to $V_{NO+}$. If each conductive array line carried ½ $V_W$, the current path would be the memory plug at the intersection of the two conductive array lines that each carried ½ $V_W$. The other memory plugs would exhibit such high resistances from the non-ohmic characteristic that current would not flow through the half-selected plugs.

A non-ohmic device might be used to cause the memory plug to exhibit a non-linear resistive characteristic. Exemplary non-ohmic devices include three-film metal-insulator-metal (MIM) structures and back-to-back diodes in series. Separate non-ohmic devices, however, may not be necessary. Certain fabrications of the memory plug can cause a non-ohmic characteristic to be imparted to the memory cell. While a non-ohmic characteristic might be desirable in certain arrays, it may not be required in other arrays.

Electrodes will typically be desirable components of the memory plugs, a pair of electrodes sandwiching the memory element. If the only purpose of the electrodes is as a barrier to prevent metal inter-diffusion, then a thin layer of non-reactive metal, e.g. TiN, TaN, Pt, Au, and certain metal oxides could be used. However, electrodes may provide advantages beyond simply acting as a metal inter-diffusion barrier. Electrodes (formed either with a single layer or multiple layers) can perform various functions, including: prevent the diffusion of metals, oxygen, hydrogen and water; act as a seed layer in order to form a good lattice match with other layers; act as adhesion layers; reduce stress caused by uneven coefficients of thermal expansion; and provide other benefits. Additionally, the choice of electrode layers can affect the memory effect properties of the memory plug and become part of the memory element.

The "memory element electrodes" are the electrodes (or, in certain circumstances, the portion of the conductive array lines) that the memory elements are sandwiched in-between. As used herein, memory element electrodes are what allow other components to be electrically connected to the memory element. It should be noted that in both cross point arrays and transistor memory arrays have exactly two memory element electrodes since the memory plug has exactly two terminals, regardless of how many terminals the memory cell has. Those skilled in the art will appreciate that a floating gate in a transistor, if used as a memory element, would have exactly three memory element electrodes (source, drain and gate).

Memory Effect

The memory effect is a hysteresis that exhibits a resistive state change upon application of a voltage while allowing non-destructive reads. A non-destructive read means that the read operation has no effect on the resistive state of the memory element. Measuring the resistance of a memory cell is generally accomplished by detecting either current after the memory cell is held to a known voltage, or voltage after a known current flows through the memory cell. Therefore, a memory cell that is placed in a high resistive state $R_0$ upon application of $-V_W$ and a low resistive state $R_1$ upon application of $+V_W$ should be unaffected by a read operation performed at $-V_R$ or $+V_R$. In such materials a write operation is not necessary after a read operation. It should be appreciated that the magnitude of $|-V_R|$ does not necessarily equal the magnitude of $|+V_R|$.

Furthermore, it is possible to have a memory cell that can be switched between resistive states with voltages of the same polarity. For example, in the paper "The Electroformed metal-insulator-metal structure: a comprehensive model," (already incorporated by reference) Thurstans and Oxley describe a memory that maintains a low resistive state until a certain $V_P$ is reached. After $V_P$ is reached the resistive state can be increased with voltages. After programming, the high resistive state is then maintained until a $V_T$ is reached. The $V_T$ is sensitive to speed at which the program voltage is removed from the memory cell. In such a system, programming $R_1$ would be accomplished with a voltage pulse of $V_P$, programming $R_0$ would be accomplished with a voltage pulse greater than $V_P$, and reads would occur with a voltages below $V_T$. Intermediate resistive states (for multi-level memory cells) are also possible.

The $R_1$ state of the memory plug may have a best value of 10 k$\Omega$ to 100 k$\Omega$. If the $R_1$ state resistance is much less than 10 k$\Omega$, the current consumption will be increased because the cell current is high, and the parasitic resistances will have a larger effect. If the $R_1$ state value is much above 100 k$\Omega$, the RC delays will increase access time. However, workable single state resistive values may also be achieved with resistances as low as 5 k$\Omega$ and as high as 1M$\Omega$. Typically, a single state memory would have the operational resistances of $R_0$ and $R_1$ separated by a factor of 10.

Since memory plugs can be placed into several different resistive states, multi-bit resistive memory cells are possible. Changes in the resistive property of the memory plugs that are greater than a factor of 10 might be desirable in multi-bit resistive memory cells. For example, the memory plug might have a high resistive state of $R_{00}$, a medium-high resistive state of $R_{01}$, a medium-low resistive state of $R_{10}$ and a low resistive state of $R_{11}$. Since multi-bit memories typically have access times longer than single-bit memories, using a factor greater than a 10 times change in resistance from $R_{11}$ to $R_{00}$ is one way to make a multi-bit memory as fast as a single-bit memory. For example, a memory cell that is capable of storing two bits might have the low resistive state be separated from the high resistive state by a factor of 100. A memory cell that is capable of storing three or four bits of information might require the low resistive state be separated from the high resistive state by a factor of 1000.

Although the memory effect properties of the memory plug appear to be dominated by carrier trapping, other carrier transport mechanisms such as oxygen migration or electrolyte migration may be present. Even within carrier charge trapping, dominant factors can include space-charge limited currents, thermionic emission limited conduction, electrothermal Poole-Frenkel emission, or Fowler-Nordheim quantum tunneling. While the inventors note that experimental data is consistent with memory effects being created primarily by carrier trapping, they do not wish to be bound by any explanation of how a memory effect is created or how any other effect that is described herein functions.

As previously described, forming is one technique that can be used in metal-insulator-metal structures in order to induce a memory effect. However, it is generally not practical to form a structure within a commercial memory product. Therefore, processing techniques are required to either eliminate the need for forming or create conditions that make forming possible in high-volume manufacturing.

Creating the Memory Effect

Interfacial layers are one mechanism that can be used to create a memory effect. An interface layer is typically a very thin layer because the reaction that is created by placing the oxide in contact with the reactive metal only extends a short distance, typically less than 100 angstroms. The thickness of the interfacial layer can be controlled by limiting the thickness of the reactive metal. Although the interfacial layer can be placed into different resistive states, even the lowest resistive state is typically very insulating. Accordingly, a thick interfacial layer would not allow any current to pass through the memory cell in an optimal period of time. To allow rapid access times (on the order of tens of nanoseconds, typically below 100 ns) in small dimension devices (on the order of hundreds of nanometers), the entire memory plug should have a resistivity of not more than about 1 ohm-cm.

The oxide will generally (but not necessarily) be a conductive crystalline metal oxide—either as a single crystalline structure or a polycrystalline structure. One class of conductive oxides are perovskites that include two or more metals, the metals being selected from the group consisting of transition metals, alkaline earth metals and rare earth metals.

The perovskites (generally in the form of $ABX_3$ structures, where A has an atomic size of 1.0–1.4 Å and B has an atomic size of 0.45–0.75 Å for the case where X is either oxygen or fluorine) can be any number of compositions, including manganites (e.g., $Pr_{0.7}Ca_{0.3}MnO_3$, $Pr_{0.5}Ca_{0.5}MnO_3$ and other PCMOs, LCMOs using lanthanum and calcium as A, etc.), titanates (e.g., $SrTiO_3$), and zirconates (e.g., $SrZrO_3$). Some perovskites can be doped with various elements, such as Nb, in order to make them less insulating. $MnO_3$, when combined with the rare earth metals La, Pr or some combination thereof and the alkaline earth metals Ca, Sr or some combination thereof have been found to be particularly effective for use in the memory plug.

Further, some oxides that may not be conductive in their pure form may be used as they become conductive through the addition of dopants, or if they are used as a very thin layer (e.g., in the order of tens of Angstroms) in which case tunneling conduction can be achieved. Therefore, as will be appreciated by those skilled in the art, oxides that are classified as insulators, but are thin enough to allow tunneling conduction, can still be considered conductive oxides. Since a memory plug will need to be able to be switched at low currents, low resistances are desirable—making conductive oxides more attractive than insulating oxides.

Whether a metal is a reactive metal is determined by its relation to the perovskite, and whether the metal is a strong enough reducing agent to reduce the semiconductive metal oxide and be oxidized. For example, Al will reduce a PCMO perovskite. Other reactive metals, depending on the semiconductive metal oxide, can include Ta, Ti, Zr, Y, Hf, Cr and Mg. It should be appreciated that the resulting interfacial layer may not have well-defined stoichiometry, but can be more like a "soup" of Al, Pr, Ca and Mn oxides.

In one embodiment, the interfacial layer can be considered to be between the unaltered conductive oxide and the reactive metal (or reactive metal oxide, depending on the deposition technique) that does not contain any conductive oxide. If, however, only a small amount of reactive metal is deposited such that all of the reactive metal is reacted, then the interfacial layer will be between the unaltered conductive oxide and an electrode on top of the interfacial layer.

However, it should be appreciated that using a reactive metal may not be the only way to create a memory effect with a conductive oxide. Insulating and semiconductive layers having the memory effect might be able to be created through doping, implantation or use of other techniques and treatments.

For example, strontium titanate (STO) or strontium zirconate (SZO) can be doped by adding an element that has a different preferred oxidation state (a different charge when ionized) when it replaces an element in the crystal matrix. Typically, the dopant would make up less than 10% molecular percentage of the total material. In SZO, chromium (Cr), with a +3 oxidation state, can replace zirconium (Zr) with a +4 oxidation state. Charge imbalance is compensated by either creation of appropriate vacancies (e.g., oxygen vacancies), by change of valence on a matrix element, or by introduction of free carriers (electrons or holes).

A dopant atom usually substitutes for a matrix element based, at least partly, on the similarity of ionic radii. Thus lanthanum (La) primarily substitutes for strontium (Sr) whereas Cr primarily substitutes for Zr in SZO. In SZO, cation vacancies are rare (i.e., there are few Sr and Zr vacancies), but anion vacancies (i.e., oxygen) are common. Therefore, adding Cr to SZO generates both oxygen vacancies and free holes. However, Cr addition is usually compensated by oxygen vacancies (one vacancy for every two Cr atoms) such that the material remains essentially insulating. In contrast, free electrons primarily compensate for La in SZO. Therefore adding La drastically lowers the resistance of SZO. Similarly tantalum (Ta) or niobium (Nb) can substitute for Zr to lower SZO resistivity.

Further, vacancies (either anion or cation) can also act to create charge traps. The charge imbalance caused by a vacancy can be compensated by the same mechanisms that compensate for the intentional additions of a dopant. Thus, an oxygen vacancy compensated by 2 Cr atoms provides no free carriers, but if there is insufficient Cr for full compensation, oxygen vacancies lead to free electrons.

Some dopants create centers at deep levels in the bandgap. Such dopants create centers where a charge would need a high level of energy to exit that level, effectively creating traps with the deep levels. For example, Cr, iron (Fe), or nickel (Ni) can create traps in STO and SZO. To the contrary, yttrium (Y), La, Nb and Ta would create centers at shallow levels, which would not be traps.

Treatment can additionally occur through, for example, ion implantation. In ion implantation accelerated ions penetrate a solid surface up to certain depth that is determined by the ion energy. Ion implantation can be used to introduce dopants, to form buried layers, and to modify solid surfaces.

Another treatment method is to expose a reactive metal or a conductive oxide to either an anneal or a gas at a given temperature within a given ambient. Some anneals can be easily integrated into fabrication. For example, if the array only has a single memory plug layer, then the bottom layers might be subjected to high temperatures in order to properly form the conductive oxide. However, the top layers can then be deposited at temperatures far below what is necessary for forming the conductive oxide. Similar results can be obtained by laser treating one of the surfaces, or exposing one of the surfaces to a plasma process (such as plasma etching).

Another treatment method might be to expose the entire structure and/or a particular surface layer to a physical re-sputtering, typically by using. Ar and/or $O_2$ or other inert gas plasma. Re-sputtering is a technique commonly used to clean-up surfaces. Since a new film is not deposited when the plasma hits the surface in the sputtering chamber, it can be considered to be the opposite of sputtering. Similarly, the surface can be exposed to an inert ion from an ion gun, bombarding the surface with accelerated inert ions, such as ionized Ar.

Typically, the goal of such treatments is to create traps. Traps can also be introduced with high energy radiation or particle beam bombardment. For example, UV and X-ray radiation induces traps in $SiO_2$. Also, neutron transmutation doping can be used to create dopant atoms in silicon. Furthermore, traps can be created by an electrical initialization process during which oxygen vacancies drift through an oxide in the presence of an applied electric field. Of course, the dominant carrier mechanisms may change depending upon the treatment of the interface layer.

A memory plug, therefore, has many similarities with a traditional MIM structure. However, it should be noted that many memory plugs exhibit memory characteristics regardless of whether they have been formed. It should be appreciated that the term "memory element" includes all the layers that contribute to the memory effect. Such layers, depending on the specific embodiment, can include the interface layer, the conductive oxide, reactive metal layer and/or electrodes.

Depositing conductive islands of one material within the bulk of a second, less conductive material is another way of creating the memory effect. Islands (as opposed to a continuous thin film) can be formed by a number of different processes, including sputtering, co-sputtering, evaporation, molecular beam epitaxy, atomic layer deposition, implantation, etc, and are typically related to the surface energies of the two materials. Those skilled in the art will appreciate that a first material can form islands on the surface of a second material under some processes and not others.

The density of the islands will typically be less than the percolation threshold (the point at which a continuous path of nearest neighbors could be formed from one side to another). Once the percolation threshold is reached, the layer becomes more like a thin film and less like an island structure. The size of the islands will typically be nano-structures, between 0.5 and 50 nanometers thick.

In one specific embodiment, a portion of a semiconductive material is first deposited on an electrode. Then, conductive islands are formed on the semiconductive material. After the islands are formed, another portion of the same semiconductive material is deposited on the islands. Then, either a top electrode is formed or additional island/semiconductive material layers are formed prior to the top electrode. Although forming is typically associated with insulators within an MIM structure, semiconductors are generally preferable in a memory plug because the low resistive state allows a faster access time. However, those skilled in the art will also appreciate that very thin insulators can be conductive due to charge tunneling and certain types of insulators, when placed in contact with certain electrodes, will have an appropriate work function at the electrode/insulator interface that allows charge injection.

Elemental semiconductors include antimony, arsenic, boron, carbon, germanium, selenium, silicon, sulfur, and tellurium. Semiconductor compounds include gallium arsenide, indium antimonide, and the oxides of most metals. Additionally, some perovskites also exhibit semiconductive properties.

Conductive metal islands can then be formed by depositing any number of different materials on the surface of the perovskite. A reactive metal, for example, will create a strong memory effect. However, a metal having a purely ohmic connection with the perovskite will generally not have any memory effect.

It should also be appreciated that a reactive metal may not be creating the semiconductive metal islands (for example, $AlO_2$ may be more insulating than the PCMO perovskite, but the remaining elements of Pr, Ca and Mn may themselves form a conductive island). While this is one possible explanation of the reaction that occurs within the various materials, the inventors do not wish to be bound by any explanation of how conductive islands are formed when a reactive metal is deposited on a semiconductive metal oxide.

Another possible explanation is that the conductive islands are surrounded by an insulating envelope. If such a reaction were occurring in the above example, then the islands would consist of conductive Al cores surrounded by an insulating skin of $AlO_2$, embedded within the semiconductive PCMO perovskite.

Alternatively, a memory effect can be created with a non-reactive metal, such as gold, silver or platinum. The non-reactive metal would not react with the underlying perovskite, but instead (depending on surface energies) simply preferentially nucleate into an array of conductive island structures. Although such non-reactive metals may not create as strong a memory effect, stronger memory effects can be created by increasing the size of the islands, creating multiple layers of islands, and/or modifying the Schottky barrier between the metal and the surrounding semiconductor.

In another specific example, a damascene process could be employed where an interlayer dielectric such as $SiO_2$ is patterned in order to create voids over the bottom electrodes. Aluminum oxide can then be deposited and polished off the $SiO_2$ surface such that a portion of the void is filled with aluminum oxide. A small amount of conductive metal or oxide could then be formed on top of the aluminum oxide, which will preferentially nucleate into an array of island formations on the aluminum oxide. Another layer of aluminum oxide could then be sputtered to fill more the void, followed by another polish and then another deposition of islands. A final layer of aluminum oxide could then be deposited to completely fill the void, followed by a final polish so that the $SiO_2$/aluminum oxide surface was smooth.

Timing of Discharge

Regardless of the mechanism that is used to create a memory effect, most memory cells that are applicable to the present invention are capable of being programmed with very little current. Accordingly, floating conductive array lines may create disturb conditions. If an unselected conductive array line inadvertently stays charged, it may be at a high enough voltage to affect the state of unselected cells on that line.

Discharging the selected conductive array line after a voltage has been applied is not only useful to avoid disturb conditions, but may be necessary in certain architectures where the line drivers are not strong enough to quickly drive a conductive array line from one state to another. As previously discussed, a re-programmable memory experiences at least three different operational voltages: $-V_W$ (to be programmed into a high state) $+V_W$ (to be programmed into a low state), and $V_R$ (to read the data in the cell). Each conductive array line would typically carry half of the voltage such that only the selected cells in the array would experience the full voltage. In such a system, it is possible that a conductive array line be required to be driven to half $-V_W$ immediately after being held to half $+V_W$.

Since the most common reference voltage is ground, application of the reference voltage is referred to as "discharge." However, it should be understood that the lines could be equalized (tied together to a common node) to realize the same purpose.

Figure 5:
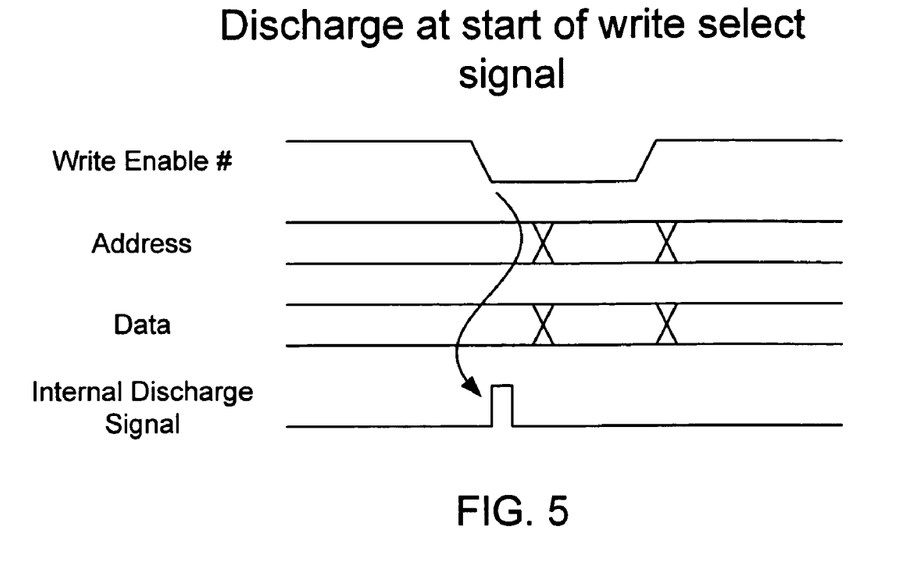
FIG. 5 depicts a timing diagram showing the falling edge of the write select signal being used to discharge the array lines.

FIG. 5 is a timing diagram showing the falling edge of the write select signal (labeled "Write Enable#") being used to discharge the array lines. Those skilled in the art will appreciate that it is common practice to use a write select signal that is active low. Therefore, the write select signal depicted in FIG. 5 is the complement of the write enable signal (identified as Write Enable #). The actual write operation is triggered by the rising edge of the Write Enable # signal with the address and data signals typically being latched. By using this falling edge, the conductive array lines are discharged prior to a write operation. The data and address information associated with the write operation are not applied to the memory array until after the conductive array lines are discharged. A discharge pulse will typically last between 5 and 10 ns.

Figure 6:
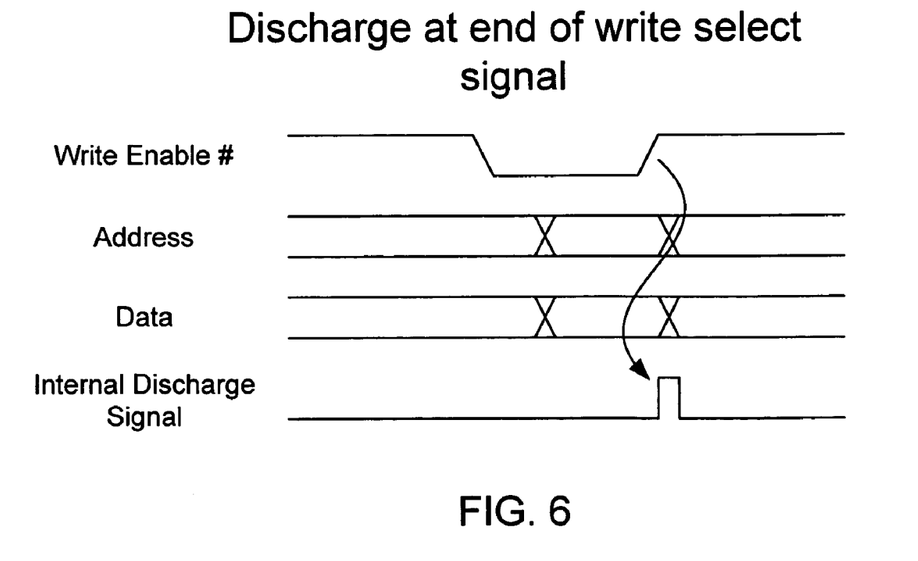
FIG. 6 depicts a timing diagram showing the falling edge of the write select signal being used to discharge the conductive array lines.

FIG. 6 is a timing diagram showing the rising edge of the write select signal being used to discharge the conductive array lines. By the time the write select signal changes state, the data and address signals usually will have been applied and become stable. However, the write operation would be delayed by the discharged time, which may not be preferable in certain architectures as it would delay the write operation and slow the performance of the memory chip.

Figure 7:
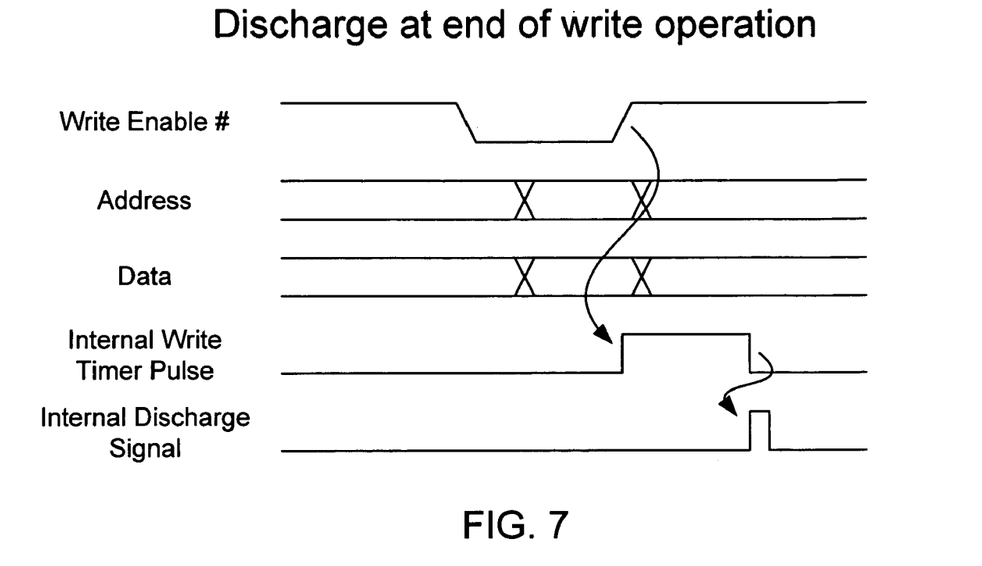
FIG. 7 depicts a timing diagram showing the conductive array lines being discharged at the end of a write operation.

FIG. 7 is a timing diagram showing the conductive array lines being discharged at the end of a write operation. A prolonged write operation could saturate or damage the memory element. Accordingly, a timer is used to terminate the internal write operation. The falling edge of the internal write timer pulse is used to trigger a discharge pulse. Use of the timer ensures that the array lines are free of charge after the write operation, and ready for further operations.

Figure 8:
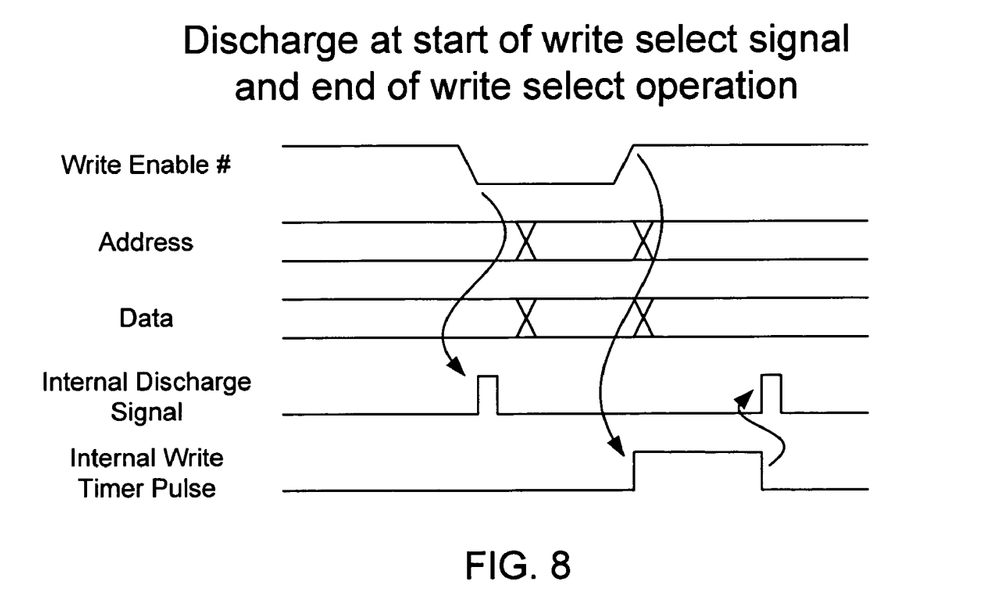
FIG. 8 depicts a timing diagram showing the array lines being discharged both as the write mode is selected and at the end of the write operation, as defined by an internal write timer pulse.

FIG. 8 is a timing diagram showing the array lines being discharged both as the write mode is selected and at the end of the write operation, as defined by an internal write timer pulse. As will be appreciated by those skilled in the art, many of the discharge schemes can similarly be combined for improved operation.

Figure 9:
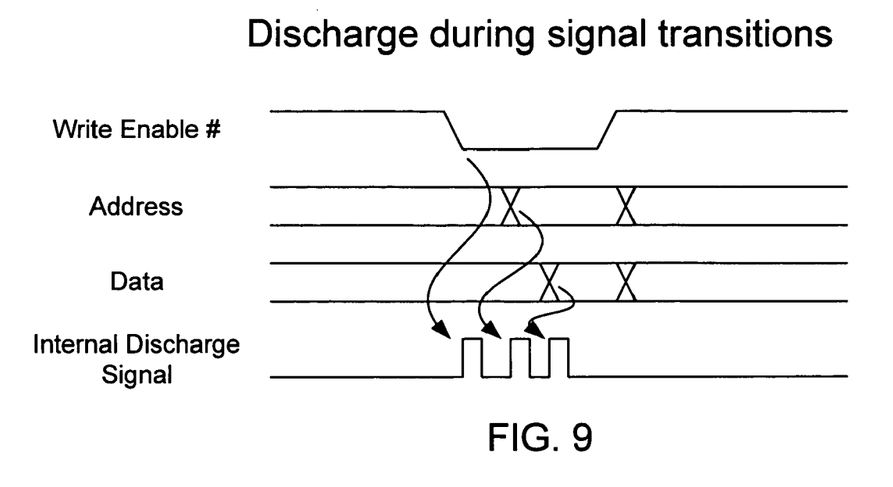
FIG. 9 depicts a timing diagram showing the array lines being discharged by the write select signal falling edge, data or address transitions.
Figure 11A:
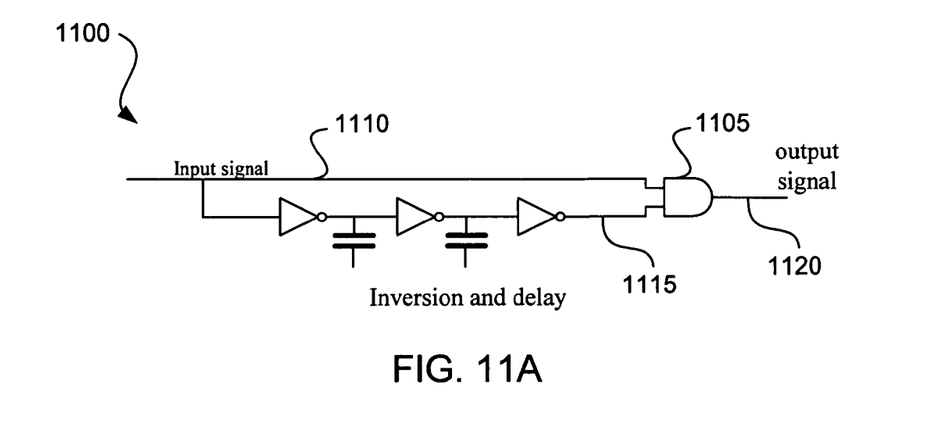
FIG. 11A depicts an exemplary schematic of a detection circuit.
Figure 11B:
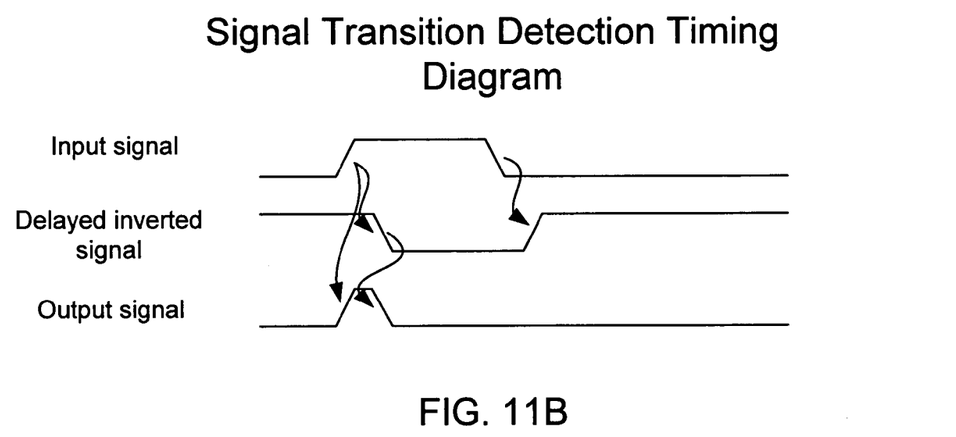
FIG. 11B depicts the timing of the detection circuit of FIG. 11A.

FIG. 9 is a timing diagram showing the array lines being discharged by the write select signal falling edge, data or address transitions. Such discharge pulses are obtained with a signal transition detector, which will be further detailed in connection with FIG. 11. Such a scheme may be beneficial if a discharge is desired while the write select signal is not switching, if only one address or one data signal switches.

Figure 10:
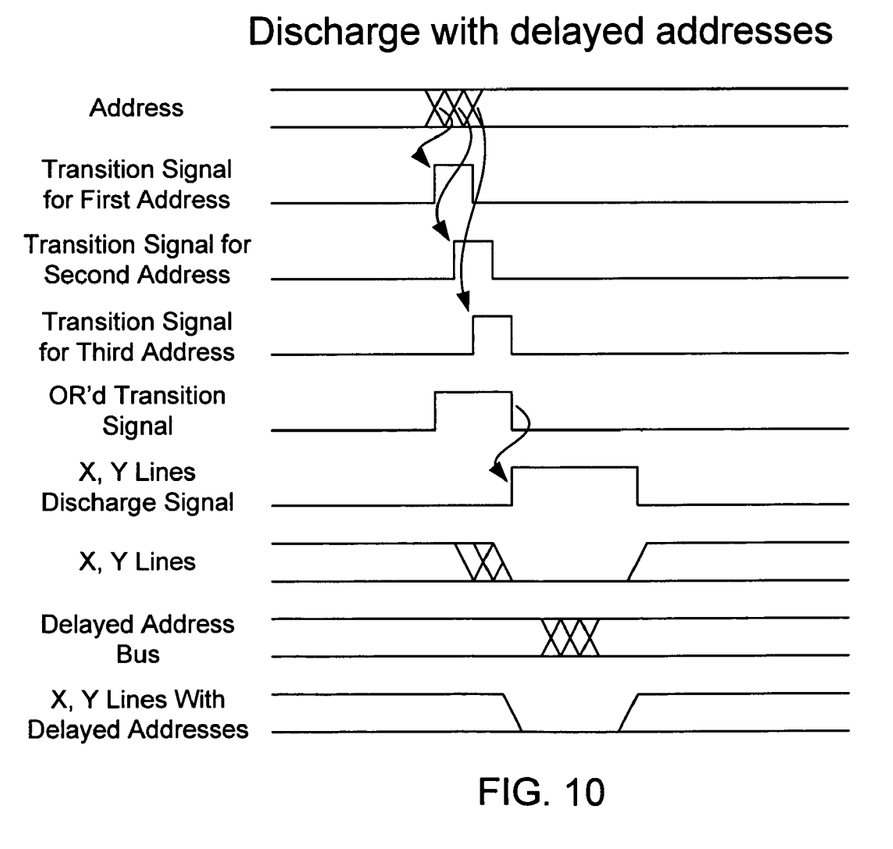
FIG. 10 depicts a timing diagram with multiple addresses switching at different times

FIG. 10 is a timing diagram with multiple addresses switching at different times. The changes in the address create multiples signal transition pulses, which can be combined as a logical OR to create a transition detection pulse. The OR'd transition signal can then either act as a discharge signal or trigger a discharge signal.

In a first approach, the discharge signal is applied to conductive array lines while addresses are being decoded. Since the address bus has address signals switching at different times, and an internal delay may occur in the circuitry generating the discharge pulse, it is possible for some unselected array lines to switch momentarily, temporarily selecting the wrong memory cells, as is depicted by the "X, Y Lines" signal in FIG. 10. During a read operation the switching noise may disturb the following read operation.

In a second more preferable approach, the address signals going to the decoders of the array lines are delayed sufficiently so that the array lines would switch during the discharge pulse. Such a technique ensures a clean operation of the conductive array lines without spurious selection of unselected memory cells, therefore reducing switching noise, as depicted by the "X, Y Lines With Delayed Addresses" signal in FIG. 10. Such a scheme can be further used for continuous write operations where new data or new addresses trigger a new write while the memory chip stays in write mode. By ensuring that address transitions are clean and no intermediate lines get selected, write cycles can be accomplished without disturb to undesired memory cells.

The detection circuit can be made in many ways. FIG. 11A shows an exemplary schematic of a detection circuit 1100. The detection circuit is a logic AND gate 1105, which compares the input signal 1110 (whose edge is to be detected) and the same signal 1110 after it has been delayed and inverted 1115. When a transition on this signal 1110 occurs, the delayed and inverted transition 1115 will reach the AND gate 1105 later than the signal 1110 itself. During the time where the delayed signal has not reached the AND gate, the output 1120 of the gate will switch and a pulse is created. FIG. 11B shows the timing of the detection circuit To detect both rising and falling edges, two such circuits can be combined, with inverted inputs and OR'ed outputs. If it is desired to trigger on only one edge (either rising or falling), only one such circuit is used.

Such a combination can be repeated for all address and control signals, and all the outputs of these circuits can be OR'ed together, so that if any of these signals transitions, a pulse will be generated. As explained above, the resulting pulse can be used to trigger a pulse of appropriate duration for discharge of the array lines. This transition detection pulse can then be used to control different elements of the memory circuits.

Concluding Remarks

Although the invention has been described in its presently contemplated best mode, it is clear that it is susceptible to numerous modifications, modes of operation and embodiments, all within the ability and skill of those familiar with the art and without exercise of further inventive activity. For example, the discharge techniques can be applied to other types of memories that switch fast with a relatively low current or amount of charge, such as chalcogenide, silver dendrite, molecular, polymer or organic memories. Accordingly, that which is intended to be protected by Letters Patent is set forth in the claims and includes all variations and modifications that fall within the spirit and scope of the claim.

What is claimed is:

1. A re-writable memory, comprising:
   a memory array including
      a plurality of two-terminal memory devices, each two-terminal memory device having a memory plug capable of reversibly switching from a first resistance state to a second resistance slate;
      a first plurality of conductive lines arranged such that each of the two-terminal memory devices have a first terminal in electrical contact with one of the first plurality of conductive array lines; and
      a second plurality of conductive array lines arranged such that each of the two-terminal memory devices have a second terminal in electrical contact with one of the second plurality of conductive array lines;
   peripheral circuitry capable of receiving external signals, the peripheral circuitry causing a reference voltage to be applied to the first plurality of conductive lines in response to at least one of the external signals.

2. The re-writable memory of claim 1, wherein the at least one of the external signals are control signals that select between read and write modes.

3. The re-writable memory of claim 1, wherein:
the at least one of the external signals is a write enable signal; and
the reference voltage is applied in response to the write enable signal changing state to indicate the beginning of a write mode.

4. The re-writable memory of claim 1, wherein:
the at least one of the external signals is a write enable signal; and
the reference voltage is applied in response to the write enable signal changing state to indicate the end of a write mode.

5. The re-writable memory of claim 4, wherein there is a delay between the write enable signal changing state and the reference voltage being applied.

6. The re-writeable memory of claim 5, wherein an internal timer delineates the delay, the internal timer being initiated by the write enable signal changing state.

7. The re-writeable memory of claim 4, wherein the peripheral circuitry additionally causes the reference voltage to be applied to the first plurality of conductive lines in response to the write enable signal changing state to indicate the beginning of the write mode.

8. The re-writable memory of claim 1, wherein:
the at least one of the external signals is an address signal; and
the reference voltage is applied in response to a change in the address signal.

9. The re-writable memory of claim 8, wherein the application of the address signal to the conductive array lines is delayed.

10. The re-writable memory of claim 9, wherein:
the peripheral circuitry includes address decoders that select conductive array lines from the first plurality of conductive array lines and the second plurality of conductive array lines; and
the address signal is delayed before being decoded.

11. The re-writable memory of claim 9, wherein:
the peripheral circuitry includes address decoders that select conductive array lines from the first plurality of conductive array lines and the second plurality of conductive array lines with a decoded address signal; and
the decoded address signal is delayed.

12. The re-writable memory of claim 1, wherein:
the at least one of the external signals is a data signal; and
the reference voltage is applied in response to a change in the data signal.

13. The re-writable memory of claim 1, wherein the memory plug includes a multi-resistive state element, the multi-resistive state element being selected from the group consisting of silver dendrite, conductive metal oxide, polymer and organic compound.

14. The re-writable memory of claim 1, wherein the peripheral circuitry additionally causes causing the reference voltage to be applied to the second plurality of conductive lines.

15. The re-writable memory of claim 1, wherein the reference voltage is ground.

16. A method for accessing memory, comprising:
providing conductive lines that are operable to carry signals;
receiving an address;
receiving an indication that a write operation is desired;
energizing selected conductive lines responsive to the address, the selected conductive lines being energized to at least a write threshold, whereby the selection of the selected conductive lines and at least the application of the write threshold occurs simultaneously;
applying a reference voltage to at least the selected conductive lines in connection with the write operation.

17. The method of claim 16, wherein:
a write mode is indicative of a write operation being desired; and
the reference voltage is applied in response to a transition in write mode.

18. The method of claim 17, wherein the reference voltage is applied in response to the selection of the write mode.

19. The method of claim 18, wherein the reference voltage is applied immediately after the write mode has been selected.

20. The method of claim 18, wherein the reference voltage is applied after a delay.

21. The method of claim 17, wherein the reference voltage is applied in response to the write mode transitioning from a selected mode to an unselected mode.

22. The method of claim 21, wherein the reference voltage is applied immediately after the write mode has transitioned.

23. The method of claim 17, wherein the reference voltage is applied after a delay.

24. The method of claim 16, wherein the memory includes memory cells that have a multi-resistive state element capable of reversibly switching from a first resistance state to a second resistance state.

25. The method of claim 24, wherein the reference voltage is not applied when any multi-resistive state elements are in the process of switching resistive states.

26. The method of claim 25, wherein the reference voltage is applied immediately after a multi-resistive state element has switched resistive states.

27. The method of claim 24, wherein the multi-resistive state element includes a conductive metal oxide.

28. The method of claim 16, wherein the reference voltage is applied for a pulse of not longer than 10 ns in duration.

29. The method of claim 28, wherein the reference voltage is applied for a pulse of not longer than 5 ns in duration.

30. A re-writable non-volatile memory, comprising:
conductive lines that can access a plurality of memory cells within a re-writable non-volatile memory array, wherein each memory cell has exactly two memory element electrodes;
an address bus that carries signals that identify memory cells within the memory array;
a data bus that carries signals that identify data associated with the memory cells;
a control bus that carries control signals;
peripheral circuits that enables storing information in the memory array and reading information from the memory array, the peripheral circuits including discharge circuits to discharge the conductive lines and detection circuits to detect when a change in at least one of the signals carried by the address, data or control bus occurs, and
wherein some conductive lines are discharged when the detection circuit detects a change.

31. The re-writable non-volatile memory of claim 30, wherein the discharge is delayed.

32. The re-writable non-volatile memory of claim 31, wherein the peripheral circuits include decoding circuits to select the identified memory cells, the decoding circuits having an output that is delayed, whereby the delay reduces switching noise on the conductive lines.

33. The re-writable non-volatile memory of claim 31, wherein the peripheral circuits include decoding circuits to select the identified memory cells, the decoding circuits having an input that is delayed, whereby the delay reduces switching noise on the conductive lines.

34. The re-writable non-volatile memory of claim 30, wherein
the control signals include at least a write enable signal, the write enable signal capable of being either asserted or unasserted; and
the some conductive lines are discharged when the detection circuit detects a change in the write enable signal from being asserted to being unasserted.

35. The re-writable non-volatile memory of claim 30, wherein a write operation is performed in less than 200 ns.

36. Peripheral circuitry comprising:
conductive array lines;
address decoding circuitry that is operable to select some conductive array lines such that the selected conductive array lines are energized to a first write voltage, a second write voltage or a read voltage, the first write voltage being effective to place a memory cell in a first resistive state and the second write voltage being effective to place the memory cell in a second resistive state, wherein the memory cell has exactly two memory element electrodes;
a write timer that limits the period of time that either a first voltage or a second voltage are applied to the conductive array line;
sensing circuitry that is able to read information stored in the memory cell when a read voltage is applied to the conductive array lines.

37. The peripheral circuitry of claim 36, wherein the period of time is less than 200 ns.

38. A re-writable non-volatile memory, comprising:
a re-writable non-volatile memory array that includes a plurality of memory cells that, upon application of a first voltage, can be placed in a first resistive state and, upon application of a second voltage, can be placed in a second resistive state;
an address bus that carries signals that identify memory cells within the memory array;
a data bus that carries signals that identify data associated with the memory cells; and
peripheral circuits that enables information to be stored in the memory array and information to be read from the memory array, the peripheral circuitry including latches that temporarily store signals from either the address bus or the data bus or both;
wherein reading information from the memory array can be accomplished in a first period of time and storing information in the memory array can be accomplished in a second period of time that is within an order of magnitude of the first period of time.

39. The re-writable non-volatile memory of claim 38, wherein both the first period of time and the second period of time is not greater than 200 ns.

40. The re-writable non-volatile memory of claim 38 further comprising:
a control bus that carries control signals that include at least a write enable signal, the write enable signal capable of being either asserted or unasserted; and
wherein the data and address signals are latched when the write enable signal is unasserted.

41. The re-writable non-volatile memory of claim 38, wherein the first voltage and the second voltages are not applied to the memory cells until after data and address signals have been temporarily stored in the latches.

42. The re-writable non-volatile memory of claim 38, wherein the memory cells include a conductive metal oxide.

43. A re-writable non-volatile memory, comprising:
a re-writable non-volatile memory array that includes a plurality of memory cells that, upon application of a first voltage, can be placed in a first resistive state and, upon application of a second voltage, can be placed in a second resistive state;
a control bus that carries control signals that include at least a write enable signal, the write enable signal capable of being either asserted or unasserted;
an address bus that carries signals that identify memory cells within the memory array; and
a data bus that carries signals that identify data associated with the memory cells;
wherein reading information from the memory array can be accomplished in a first period of time and storing information in the memory array can be accomplished in a second period of time that is within an order of magnitude of the first period of time; and
wherein the first voltage and the second voltages are not applied to the memory cells until after the write enable signal has transitioned from being asserted to being unasserted.

* * * * *